(12) United States Patent
Saxena et al.

(10) Patent No.: US 10,546,647 B2
(45) Date of Patent: Jan. 28, 2020

(54) WIDE RANGE ZERO TEMPERATURE COEFFICIENT OSCILLATORS AND RELATED DEVICES AND METHODS

(71) Applicant: SanDisk Technologies LLC, Plano, TX (US)

(72) Inventors: Deep Saxena, Bengaluru (IN); Saurabh Kumar Singh, Edinburgh (GB)

(73) Assignee: Sandisk Technologies LLC, Plano, TX (US)

( * ) Notice: Subject to any disclaimer, the term of this patent is extended or adjusted under 35 U.S.C. 154(b) by 0 days.

(21) Appl. No.: 15/633,747

(22) Filed: Jun. 26, 2017

(65) Prior Publication Data

US 2018/0374544 A1 Dec. 27, 2018

(51) Int. Cl.
*G11C 16/32* (2006.01)
*H03B 5/04* (2006.01)
*G11C 16/26* (2006.01)

(52) U.S. Cl.
CPC .............. *G11C 16/32* (2013.01); *G11C 16/26* (2013.01); *H03B 5/04* (2013.01)

(58) Field of Classification Search
CPC ............ G11C 16/32; G11C 16/26; H03B 5/04
USPC .................................................... 365/185.19
See application file for complete search history.

(56) References Cited

U.S. PATENT DOCUMENTS

| | | | | |
|---|---|---|---|---|
| 6,339,349 B1* | 1/2002 | Rajagopalan | ........ | H03K 3/0315 327/131 |
| 9,344,094 B2* | 5/2016 | Waldrip | ................... | H03L 1/022 |
| 2001/0017574 A1* | 8/2001 | Oka | ........................ | H03L 1/023 331/116 R |
| 2003/0156622 A1* | 8/2003 | Gold | ........................ | G01K 7/01 374/170 |
| 2004/0189417 A1* | 9/2004 | Fujita | ........................ | H03B 5/04 331/177 V |
| 2006/0071728 A1* | 4/2006 | Chen | ........................ | H03L 1/027 331/158 |
| 2007/0147571 A1* | 6/2007 | Yu | ........................ | H03K 21/023 377/47 |
| 2008/0025729 A1* | 1/2008 | Funada | .................. | H04B 10/40 398/136 |
| 2008/0048726 A1* | 2/2008 | Hafed | ................ | G01R 31/2882 327/9 |
| 2009/0021310 A1* | 1/2009 | Tai | .......................... | H03L 1/022 331/2 |

(Continued)

*Primary Examiner* — Sung Il Cho
(74) *Attorney, Agent, or Firm* — Stoel Rives LLP; Joseph J. Hawkins

(57) ABSTRACT

An oscillator circuit includes a voltage controlled oscillator (VCO) configured to generate a clock signal having a clock period that is adjustable based on a control signal. The oscillator circuit includes a time to voltage converter configured to receive the clock signal and generate a compensation voltage potential that is proportional to the clock period and a zero temperature coefficient (ZTC) current. The oscillator circuit includes an amplifier configured to generate the control signal responsive to the compensation voltage potential and a temperature independent reference voltage potential. A method includes applying a control signal to a VCO, generating a clock signal having a clock period responsive to the control signal, generating a compensation voltage potential, and adjusting the clock period using the compensation voltage potential. A memory device includes the oscillator circuit.

21 Claims, 7 Drawing Sheets

(56) References Cited

U.S. PATENT DOCUMENTS

| | | | | |
|---|---|---|---|---|
| 2011/0316595 A1* | 12/2011 | Bolton | H03L 1/022 | 327/156 |
| 2012/0063195 A1* | 3/2012 | Lam | G11C 11/5642 | 365/148 |
| 2012/0081188 A1* | 4/2012 | Liu | H03L 1/023 | 331/179 |
| 2012/0223771 A1* | 9/2012 | Zhang | H03L 1/02 | 327/586 |
| 2012/0286890 A1* | 11/2012 | Terasawa | H03L 1/022 | 331/176 |
| 2012/0326797 A1* | 12/2012 | Chiu | H03B 5/1228 | 331/36 C |
| 2013/0015895 A1* | 1/2013 | Nguyen | H03L 1/027 | 327/156 |
| 2013/0106476 A1* | 5/2013 | Joubert | H03L 1/00 | 327/156 |
| 2014/0218123 A1* | 8/2014 | Wei | H03B 5/04 | 331/176 |
| 2014/0225662 A1* | 8/2014 | Nishi | G05F 1/10 | 327/539 |
| 2014/0354365 A1* | 12/2014 | Gao | H03L 1/023 | 331/70 |
| 2015/0076325 A1* | 3/2015 | Higuchi | H04N 5/357 | 250/208.1 |
| 2015/0180486 A1* | 6/2015 | Shanan | H03L 7/099 | 327/156 |
| 2015/0198966 A1* | 7/2015 | Lee | G06F 1/08 | 713/501 |
| 2015/0349712 A1* | 12/2015 | Hung | H03B 5/1265 | 331/117 R |
| 2016/0322977 A1* | 11/2016 | Forstner | H03L 1/022 | |
| 2016/0360138 A1* | 12/2016 | Meynants | H01L 27/14609 | |
| 2017/0077943 A1* | 3/2017 | Saint Martin | H03M 1/0634 | |
| 2017/0117908 A1* | 4/2017 | Ortner | H03L 1/02 | |
| 2017/0255220 A1* | 9/2017 | Sivakumar | G05F 3/267 | |
| 2018/0198451 A1* | 7/2018 | Jung | H03L 1/022 | |

* cited by examiner

WIDE RANGE ZERO TEMPERATURE COEFFICIENT OSCILLATORS AND RELATED DEVICES AND METHODS

TECHNICAL FIELD

This disclosure relates to wide-range, zero temperature coefficient (ZTC) oscillators and related devices and methods. More specifically, this disclosure relates to precision temperature and process independent oscillators used for timing of ramp voltage potentials in memory operations.

BACKGROUND

Some memory devices use ramped voltage potentials (e.g., Flash memory devices) to detect memory states of memory cells (e.g., by detecting a threshold voltage potential of Flash memory cells). In Flash memory, a Ramp Word Line Sense (RWS) mode may reduce read and program verify cycle time. During RWS mode, read voltage ramps linearly and data is strobed out based on the threshold voltage distribution of a memory cell of interest. In some memory devices, ramp rate control is achieved by using a clock (e.g., resistor capacitor (RC) relaxation oscillators, ring oscillators, etc.).

DETAILED DESCRIPTION OF PREFERRED EMBODIMENTS

Figure 1:
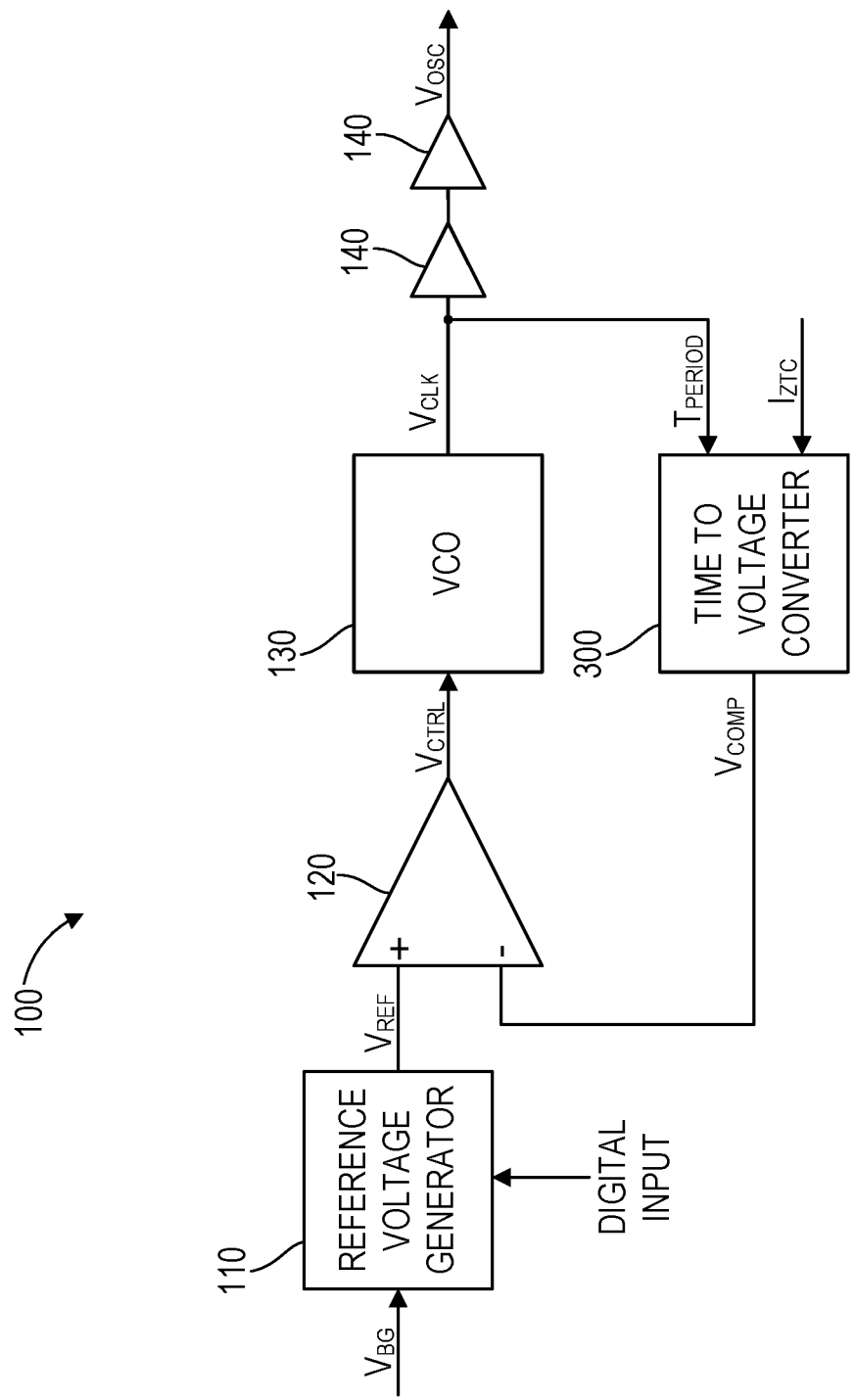
FIG. 1 is a simplified mixed schematic illustration of an oscillator circuit, according to some embodiments.

Oscillators used in semiconductor devices (e.g., to control ramp rate of ramped voltage potentials in memory devices) sometimes produce clock periods that drift with temperature and semiconductor process differences. Drift in clock period can lead to erroneous reads in memory devices, and other adverse consequences in other semiconductor devices. For example, drift of twenty percent (20%) in clock period may occur responsive to a temperature shift between −40° C. and 85° C. Even a temperature shift of as small as 1° C. may be enough to cause a frequency drift of about 0.2%. Also, oscillators may suffer from small tuning range and variable tuning step across temperature, each of which makes them unsuitable for systems where linearity of clock period step is critical.

Disclosed herein are wide range, zero temperature coefficient oscillators and related devices and methods. The embodiments of the disclosed oscillator circuit may comprise a voltage controlled oscillator (VCO) configured to receive a control signal and generate a clock signal having a clock period that adjusts in response to the control signal; a time to voltage converter operably coupled to the VCO and configured to receive the clock signal and generate a compensation voltage potential that is proportional to the clock period and a zero temperature coefficient (ZTC) current; and an amplifier operably coupled to the VCO and the time to voltage converter and configured to generate the control signal responsive to the compensation voltage potential and a temperature independent reference voltage potential.

The oscillator circuit may further comprise a reference voltage circuit operably coupled to the amplifier and configured to generate the temperature independent reference voltage potential. In some embodiments, the reference voltage circuit includes a digital to analog converter configured to adjust the reference voltage potential responsive to a bandgap voltage potential provided by a bandgap circuit and a digital input indicating one of a plurality of selectable periods of the clock signal. The bandgap circuit may be operably coupled to the reference voltage circuit. The selectable periods of the clock signal may span a period range linearly from a lowest period to a highest period, with a period step between each one of the selectable periods comprising a constant period step. The constant period step may be about one nanosecond (1 ns). The selectable periods may span a range from about thirty-five nanoseconds (35 ns) to about one hundred nanoseconds (100 ns). The clock period may not deviate by more than about one percent (1%) over a specified operational temperature range of the oscillator circuit. The specified operational temperature range of the oscillator circuit may comprise a temperature range between about −40° C. to about 120° C.

In some embodiments, the time to voltage converter includes a capacitor operably coupled to an electrically controllable switch, the electrically controllable switch configured to connect and disconnect the capacitor to the ZTC current responsive to the clock signal. The oscillator circuit may further comprise a ZTC circuit including a resistor having a resistor temperature coefficient, the ZTC circuit configured to generate the ZTC current, and a proportional to absolute temperature (PTAT) circuit having a PTAT temperature coefficient that is about the same as the resistor temperature coefficient. The PTAT circuit may be operably coupled to the ZTC circuit and may be configured to generate a PTAT voltage potential. The ZTC circuit may be configured to generate the ZTC current using the PTAT voltage potential and the resistor.

Disclosed herein are embodiments of a method for operating an oscillator circuit. Embodiments of the disclosed method may comprise applying a control signal to a voltage controlled oscillator (VCO); generating a clock signal having a clock period responsive to the control signal; generating a compensation voltage potential based on the clock period and a zero temperature coefficient (ZTC) current; and adjusting the clock period of the clock signal using the compensation voltage potential. Generating the compensation voltage potential may comprise switching an electrically controlled switch controllably coupling a capacitor to the ZTC current on and off with the clock signal, and outputting a voltage potential stored on the capacitor to generate the compensation voltage potential. In some embodiments, adjusting the clock period of the clock signal comprises maintaining the clock period within about one percent (1%) through a temperature range of about −40° C. to about 120° C. Adjusting the clock period of the clock signal may comprise adjusting the control signal. The clock period of the clock signal may be adjusted to one of a plurality of selectable clock periods. The selectable clock periods may correspond to respective fixed period steps spanning a clock period range. The selectable clock periods may range from about thirty-five nanoseconds (35 ns) to about one hundred nanoseconds (100 ns).

Disclosed herein are embodiments of a memory device comprising a plurality of memory cells. The disclosed memory device may comprise an oscillator circuit configured to generate a clock signal having a clock period that is temperature independent and adjustable over a wide period range via fixed period steps; and a read circuit operably coupled to the plurality of memory cells and the oscillator circuit. The read circuit may be configured to generate a ramp signal comprising a linearly ramped voltage potential. The ramp signal may be ramped over time. A timing of the ramping may be controlled using the clock signal. The ramp signal may be applied to one or more of the plurality of memory cells. The clock period may be temperature independent over a temperature range spanning about 160° C. The wide period range over which the clock signal is adjustable may span at least about 65 nanoseconds (ns). The fixed period steps may be substantially equal over the wide period range.

Embodiments of the disclosed oscillator circuit may comprise a voltage controlled oscillator configured to provide a clock signal having a clock period that is controllable by a control voltage potential; and means for adjusting the control voltage potential such that the clock period is adjustable over an operational period range via fixed period steps and is temperature independent over a specified operational temperature range for each of a plurality of different selectable clock periods of the clock signal.

As used herein, the terms "temperature independent" and "zero temperature coefficient" indicate that parameters (e.g., a clock period of an oscillator, a voltage potential, a current, etc.) do not deviate more than about one percent (1%) across a temperature range of about −40° C. to about 120° C.

As used herein, the terms "about," "about the same," and "about equal" acknowledge that measurements and features of devices (e.g., semiconductor devices) are usually not exact. For example, period steps between different selectable clock periods may be "about the same," or "about equal," when in reality there may be some slight deviation between the period steps, as compared to the magnitude of the period steps. For example, the term "about" may indicate deviations of less than five percent (5%), one percent (1%), or even a tenth of a percent (0.1%).

FIG. 1 is a simplified mixed schematic illustration of an oscillator circuit 100, according to some embodiments. The oscillator circuit 100 includes a reference voltage circuit 110, an amplifier 120, a voltage controlled oscillator (VCO) 130, a time to voltage converter 300, and buffers 140. The VCO 130 is configured to receive a control signal $V_{CTRL}$ and generate a clock signal $V_{CLK}$ having a clock period $T_{PERIOD}$ that is adjustable based on the control signal $V_{CTRL}$. The time to voltage converter 300 is operably coupled to the VCO 130 and configured to receive the clock signal $V_{CLK}$ and generate a compensation voltage potential $V_{COMP}$ that is proportional to the clock period $T_{PERIOD}$ of the clock signal $V_{CLK}$ and a zero temperature coefficient (ZTC) current $I_{ZTC}$. The amplifier 120 is operably coupled to the VCO 130 and the time to voltage converter 300 and configured to generate the control signal $V_{CTRL}$ responsive to the compensation voltage potential $V_{COMP}$ and a temperature independent reference voltage potential $V_{REF}$. The reference voltage circuit 110 is operably coupled to the amplifier 120 and configured to generate the reference voltage potential $V_{REF}$.

The reference voltage circuit 110 is configured to receive a bandgap voltage potential $V_{BG}$ (e.g., from a bandgap circuit 200, disclosed in further detail below with reference to FIG. 2), which is a temperature independent voltage potential. The reference voltage circuit 110 uses the bandgap voltage potential $V_{BG}$ to generate a reference voltage potential $V_{REF}$ using the bandgap voltage potential $V_{BG}$. The reference voltage potential $V_{REF}$ is temperature independent. The reference voltage circuit 110 is configured to adjust the reference voltage potential $V_{REF}$ to different values. Each of these values may correspond to a different desired clock period $T_{PERIOD}$ of the clock signal $V_{CLK}$. The clock period $T_{PERIOD}$ of the clock signal $V_{CLK}$ is adjustable to each of the different desired clock periods $T_{PERIOD}$ responsive to the different values of $V_{REF}$. By way of non-limiting example, the reference voltage circuit 110 may include a digital to analog converter configured to adjust the reference voltage potential $V_{REF}$ responsive to the bandgap voltage potential $V_{BG}$, and a digital input configured to indicate the desired clock period $T_{PERIOD}$ of the clock signal $V_{CLK}$. The digital input includes at least as many bits as is needed to indicate a desired number of the different desired clock periods $T_{PERIOD}$. The reference voltage circuit 110 is configured to provide the reference voltage potential $V_{REF}$ to the amplifier 120.

The amplifier 120 is configured to receive the reference voltage potential $V_{REF}$ from the reference voltage circuit 110 and the compensation voltage potential $V_{COMP}$ from the time to voltage converter 300. By way of non-limiting example, the amplifier 120 may include an operational amplifier, and may receive the reference voltage potential $V_{REF}$ in its non-inverting input (i.e., the time to voltage converter 300 being in a negative feedback loop), and the compensation voltage potential $V_{COMP}$ in its inverting input. Accordingly, the amplifier 120 is configured to vary the control voltage potential $V_{CTRL}$ based on variations in the reference voltage potential $V_{REF}$ and for compensatory variations in the compensation voltage potential $V_{COMP}$ that result from variations in the clock period $T_{PERIOD}$ of the clock signal $V_{CLK}$. The amplifier 120 is configured to provide the control voltage potential $V_{CTRL}$ to the VCO 130.

The VCO 130 includes an oscillator device (e.g., an oscillator circuit) that generates a periodic output (i.e., the clock signal $V_{CLK}$) having a frequency that is controlled by adjusting an input voltage potential (i.e., the control voltage $V_{CTRL}$) of the VCO 130. The VCO 130 is configured to generate the clock signal $V_{CLK}$ responsive to the control signal $V_{CTRL}$. By way of non-limiting example, the VCO 130 may include a linear (i.e., harmonic) oscillator, a relaxation oscillator, or other oscillator known in the art. These oscillators are typically temperature sensitive, semiconductor process sensitive, or a combination thereof. As adjusted using the compensation voltage potential $V_{COMP}$, however, $V_{CTRL}$ compensates the VCO 130 for these sensitivities. As a result, the clock period $T_{PERIOD}$ of the clock signal $V_{CLK}$ is not affected by temperature fluctuations inside a specified operational temperature range of the oscillator circuit 100 (e.g., about −40° C. to about 120° C.). By way of non-limiting example, the clock period $T_{PERIOD}$ may not deviate by more than about one percent (1%) over the specified operational temperature range of the oscillator circuit 100. Thus, the VCO 130, when properly controlled by $V_{CTRL}$, adjusts the frequency of the clock signal $V_{CLK}$ to eliminate temperature dependency and other dependencies of the frequency of the clock signal $V_{CLK}$.

Also, a period step between the different selectable clock periods $T_{PERIOD}$ may be set (i.e., non-variable). Furthermore, the period step may be constant over a wide frequency range (e.g., from thirty-five nanoseconds (35 ns) to one hundred nanoseconds (100 ns)). By way of non-limiting example, this constant period step may be about one nanosecond (1 ns). In other words, a plurality of different selectable clock periods $T_{PERIOD}$ may span a period range linearly from a lowest period to a highest period, with a period step between each one of the selectable periods being about a constant period step.

The time to voltage converter 300 includes circuitry that is configured to convert fluctuations in the clock period $T_{PERIOD}$ to fluctuations in the compensation voltage potential $V_{COMP}$, which the amplifier 120 uses to adjust the control voltage potential $V_{CTRL}$ that sets the period $T_{PERIOD}$ of the VCO 130. The time to voltage converter 300 may include any circuitry capable of varying an output voltage potential as a function of an input period of an input signal. By way of non-limiting example, the voltage converter 300 may include, but is not limited to: switched capacitor circuitry, filter circuitry, charge storage circuitry, combinations of various types of circuitry, and/or the like.

The time to voltage converter 300 may receive a zero temperature coefficient current $I_{ZTC}$, which may be used as a temperature independent reference for generating the compensation voltage potential $V_{COMP}$. Non-limiting embodiments for generating $I_{ZTC}$ are disclosed in further detail herein (e.g., in reference to FIG. 2). Consequently, the clock period $T_{PERIOD}$ may be relatively robust to temperature and process fluctuations. As a result, adverse consequences of temperature shift induced clock period drift may be avoided (e.g., read errors in a memory device using RWS). Further detail regarding non-limiting, exemplary embodiments of the disclosed time to voltage converter 300 are described herein (e.g., in reference to FIG. 3).

The buffers 140 serve to buffer the clock signal $V_{CLK}$ to generate an oscillator signal $V_{OSC}$. The oscillator signal $V_{OSC}$ may be more robust than the clock signal $V_{CLK}$, and therefore more suitable for use as an input to various circuit components (e.g., circuit components of a memory device such as a read circuit). In some embodiments, the buffers 140 may also produce the oscillator signal $V_{OSC}$ with a square wave from a non-square wave clock signal $V_{CLK}$ (e.g., from a sinusoidal, triangular, sawtooth, or other periodic wave to a square wave) if the clock signal $V_{CLK}$ is not a square wave.

Since the clock period $T_{PERIOD}$ of the oscillator circuit 100 is temperature and process independent, and operates over a wide range of periods, the oscillator circuit 100 may be used in devices that require a relatively high degree of accuracy and flexibility (e.g., RWS memory mode capable memory devices). Also, the oscillator circuit 100 is capable of adjusting the clock period $T_{PERIOD}$ via set period steps over a wide range of periods, which was not previously accomplished. Accordingly, the oscillator circuit 100 offers several advantages over prior known oscillator circuits.

Figure 2:
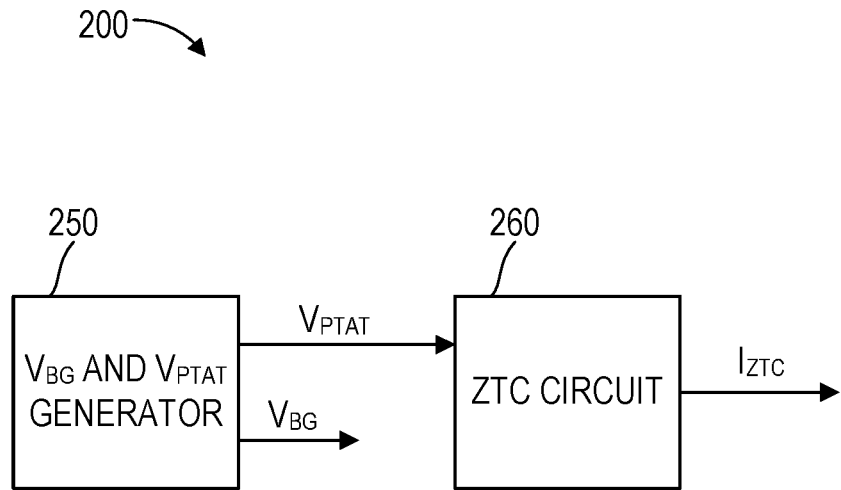
FIG. 2 is a simplified block diagram of bandgap circuitry, according to some embodiments.

FIG. 2 is a simplified block diagram of a bandgap circuit 200 (sometimes referred to herein as "BG circuit" 200), according to some embodiments. The BG circuit 200 includes a $V_{BG}$ and $V_{PTAT}$ generator 250 and a zero temperature coefficient (ZTC) circuit 260. The $V_{BG}$ and $V_{PTAT}$ generator 250 is configured to generate a PTAT voltage potential $V_{PTAT}$ and the bandgap voltage potential $V_{BG}$ of FIG. 1. By way of non-limiting example, the $V_{BG}$ and $V_{PTAT}$ generator 250 may include a Brokaw bandgap reference circuit. The $V_{BG}$ and $V_{PTAT}$ generator 250 is configured to provide the PTAT voltage potential $V_{PTAT}$ to the ZTC circuit 260.

The PTAT voltage potential $V_{PTAT}$ may have a temperature coefficient a associated therewith. Accordingly, the PTAT voltage potential $V_{PTAT}$ varies with temperature. The temperature coefficient a may be set by design parameters of the $V_{BG}$ and $V_{PTAT}$ generator 250.

The ZTC circuit 260 is configured to generate the ZTC current $I_{ZTC}$ of FIG. 1 using the PTAT voltage potential $V_{PTAT}$ provided by the $V_{BG}$ and $V_{PTAT}$ generator 250. The ZTC circuit 260 includes a resistor that has a zero Kelvin (0K) resistance $R_{0K}$ and a temperature coefficient β associated therewith. The $R_{0K}$ and β may be physical parameters of the resistor. The resistance of the resistor may vary with temperature according to the temperature coefficient β associated therewith.

The ZTC circuit 260 is configured to generate the ZTC current $I_{ZTC}$ according to the following expression:

$$I_{ZTC} = \frac{V_{PTAT0K}(1 + \alpha \Delta Temp)}{R_{0K}(1 + \beta \Delta Temp)} \quad \text{Eq. 1}$$

In Eq. 1, $V_{PTAT0K}$ is the PTAT voltage potential $V_{PTAT}$ at 0K, and ΔTemp is change in temperature. If the temperature coefficient a of the PTAT voltage potential $V_{PTAT}$ is set to be about the same as the temperature coefficient β of the resistor of the ZTC circuit 260, the ZTC current $I_{ZTC}$ will be temperature independent (zero temperature coefficient). As a result, the time to voltage converter 300 (FIGS. 1 and 3) may receive the temperature independent ZTC current $I_{ZTC}$, providing a temperature independent reference current that can be used to analyze the clock period $T_{PERIOD}$ of the clock signal $V_{CLK}$.

Figure 3:
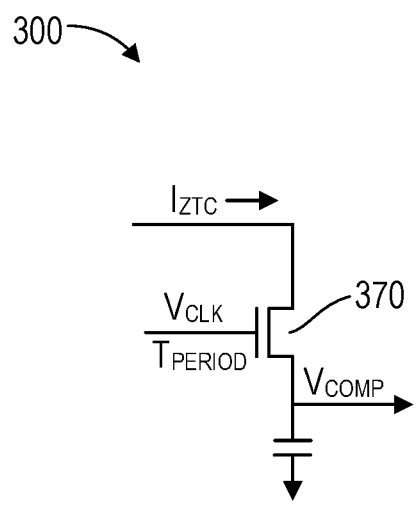
FIG. 3 is a simplified block diagram of an example of a time to voltage converter of FIG. 1.

FIG. 3 is a simplified block diagram of an example of the time to voltage converter 300 of FIG. 1. The time to voltage converter 300 is configured to convert the clock signal $V_{CLK}$ (e.g., FIG. 1) to the compensation voltage potential $V_{COMP}$, which is proportional to the clock period $T_{PERIOD}$ (FIG. 1) of the clock signal $V_{CLK}$. The time to voltage converter 300 includes a capacitor C and an electrically controllable switch 370 (e.g., a transistor) configured to selectively couple the capacitor C to the ZTC current $I_{ZTC}$ (e.g., FIGS. 1 and 2) provided by the BG circuit 200 (FIG. 2). The clock signal $V_{CLK}$ controls the electrically controllable switch 370. The compensation voltage $V_{COMP}$ may be expressed as follows:

$$V_{COMP} = \frac{I_{ZTC} * T_{PERIOD}}{C} \quad \text{Eq. 2}$$

Given the relations between $I_{ZTC}$ and $V_{COMP}$ in Eq. 2, the clock period $T_{PERIOD}$ may be expressed as follows:

$$T_{PERIOD} = \frac{V_{COMP}}{V_{PTAT0K}} CR_{0K} \quad \text{Eq. 3}$$

As disclosed herein, and as illustrated in Eqs. 1-3, both the capacitance value of capacitor C and the current $I_{ZTC}$ may be substantially independent of temperature and/or process variations. As such, the compensation voltage potential $V_{COMP}$ may vary with the clock period $T_{PERIOD}$ of the clock signal $V_{CLK}$ (and may be independent of other factors, such as temperature fluctuations, process variations, and/or the like). In some embodiments, the compensation voltage potential $V_{COMP}$ varies exclusively in response to variations of the clock period $T_{PERIOD}$ of the clock signal $V_{CLK}$. Therefore, fluctuations in the clock period $T_{PERIOD}$ may be compensated for as a function of fluctuations in the clock period $T_{PERIOD}$, without being affected by other factors, which may include, but are not limited to: process variations, temperature fluctuations, combinations of process and temperature perturbations, and/or the like. As a result, the amplifier 120 of FIG. 1, which receives the compensation voltage potential $V_{COMP}$ and adjusts the control voltage $V_{CTRL}$ responsive to the compensation voltage potential $V_{COMP}$, may compensate for perturbations in the clock period $T_{PERIOD}$ based exclusively on the clock period $T_{PERIOD}$, independently of temperature fluctuations, process variations, and/or other factors.

Figure 4:
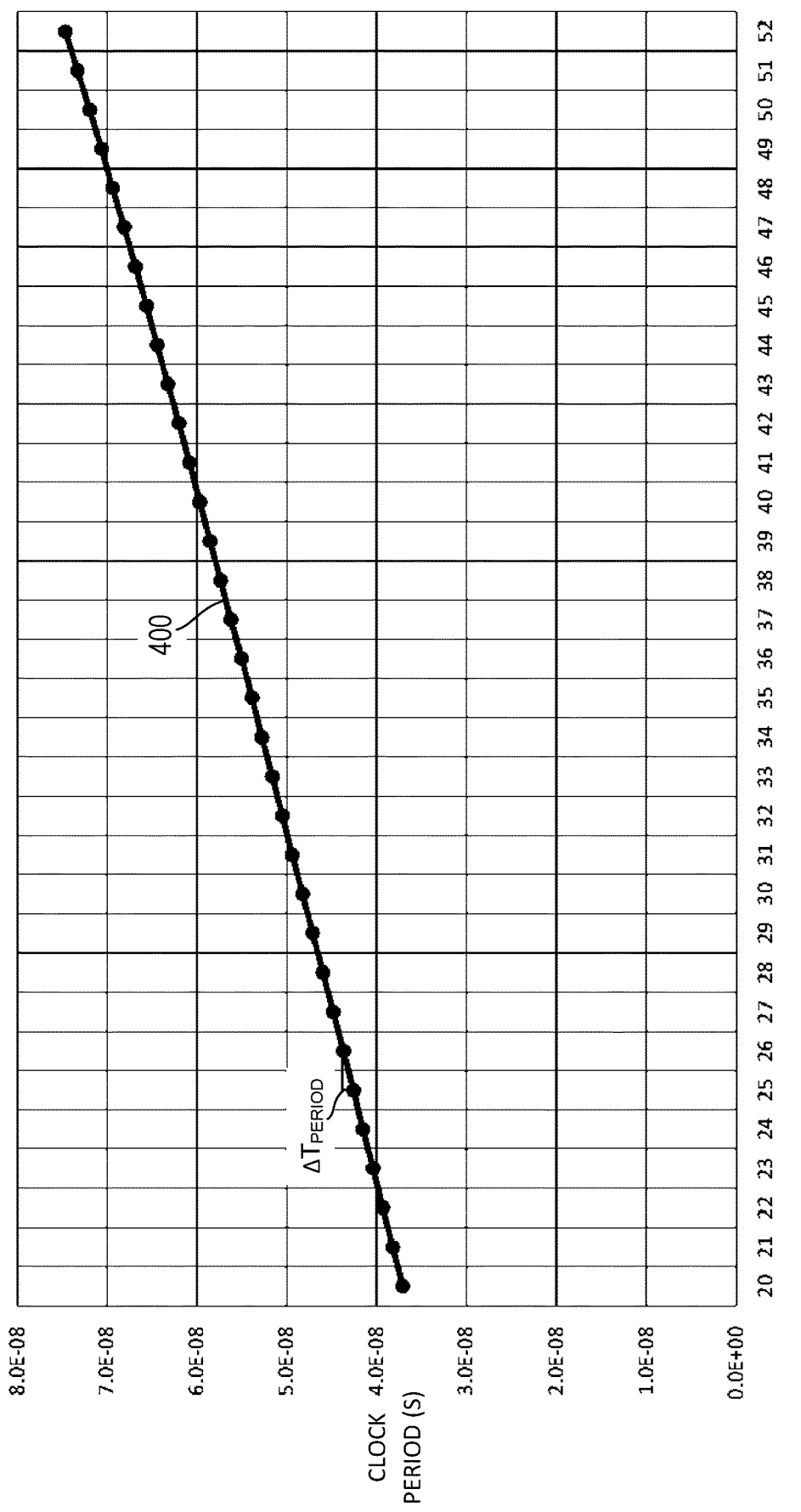
FIG. 4 is a simplified plot illustrating linearity of a clock period of the oscillator circuit of FIG. 1.

FIG. 4 is a simplified plot illustrating linearity of a clock period 400 (the clock period $T_{PERIOD}$) of the oscillator circuit 100 of FIG. 1. The clock period 400 is plotted against different digital inputs 20-52 to the reference voltage circuit 110 of FIG. 1. Each of these digital inputs corresponds to a different desired clock period $T_{PERIOD}$. As a result, the clock period 400 is plotted for each of a plurality of different desired selectable clock periods $T_{PERIOD}$. By way of non-limiting example, the clock period 400 may comprise a range from about thirty-five nanoseconds (35 ns) to about one hundred nanoseconds (100 ns).

As seen in the plot of FIG. 4, a period step $\Delta T_{PERIOD}$ between each of the different selectable clock periods is about the same, resulting in the clock period 400 approximating a straight line. By way of non-limiting example, the clock period step $\Delta T_{PERIOD}$ may be about one nanosecond (1 ns). Although the different selectable clock periods of the clock signal illustrated in FIG. 4 span a period range linearly from a lowest period to a highest period, with a period step between each one of the selectable periods being about a constant clock period step $\Delta T_{PERIOD}$, the disclosure is not so limiting. In some embodiments, there may be set clock period steps between each of the selectable clock periods, but some may be different from others, which would result in a version of the plot of FIG. 4 that does not follow a straight line.

Figure 5:
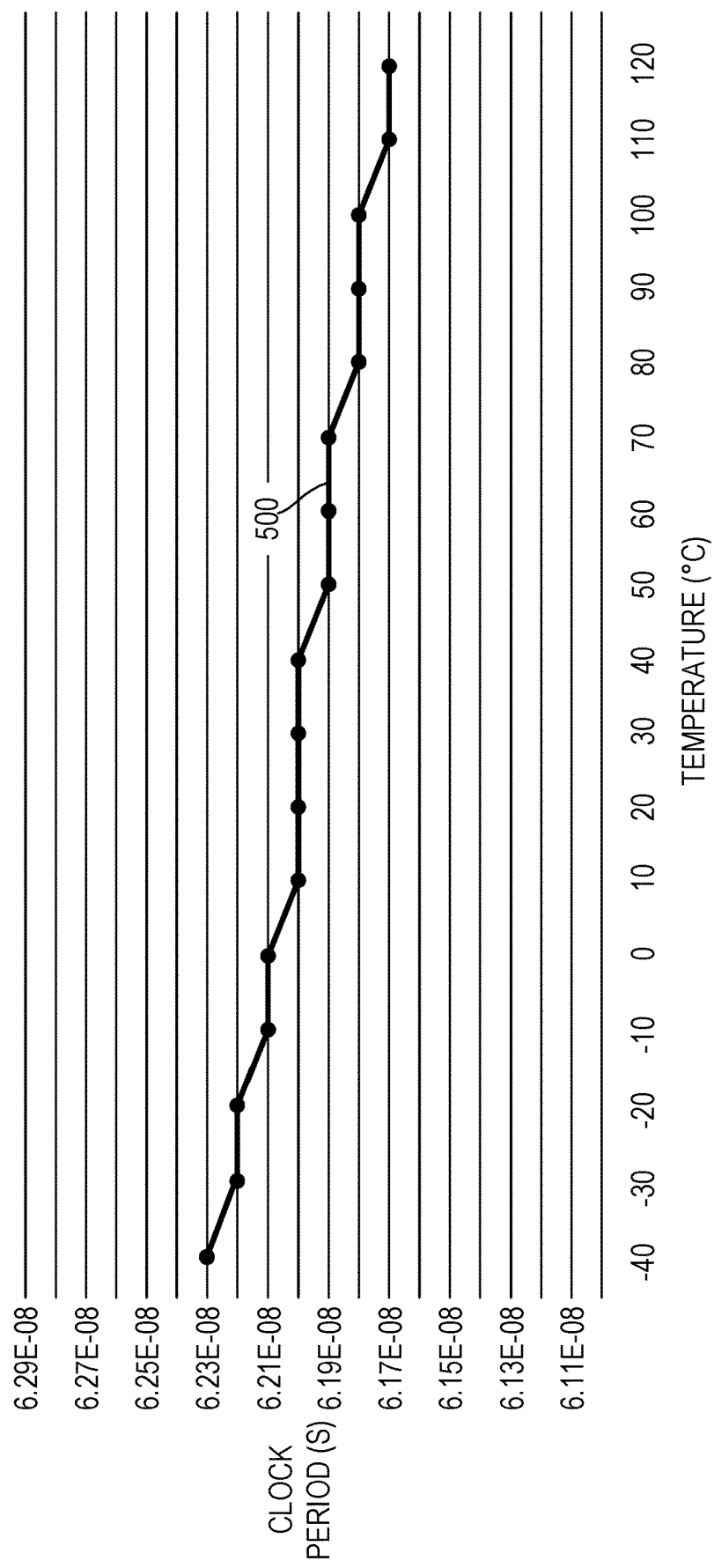
FIG. 5 is a simplified plot illustrating temperature independence of the clock period of the oscillator circuit of FIG. 1.

FIG. 5 is a simplified plot illustrating temperature independence of the clock period 500 (the clock period $T_{PERIOD}$) of the oscillator circuit 100 of FIG. 1. The clock period 500 is plotted over a temperature range of about −40° C. to 120° C. As seen in the plot of FIG. 5, the clock period 500 does not deviate by more than about one percent (1%) over this entire frequency range. Assuming a specified operation temperature range of −40° C. to 120° C., the clock period 500 may not deviate by more than about one percent (1%) over a specified operational temperature range of the oscillator circuit 100 of FIG. 1. Such temperature independence may hold while operating at any of the selectable periods of the oscillator circuit 100 of FIG. 1.

Figure 6:
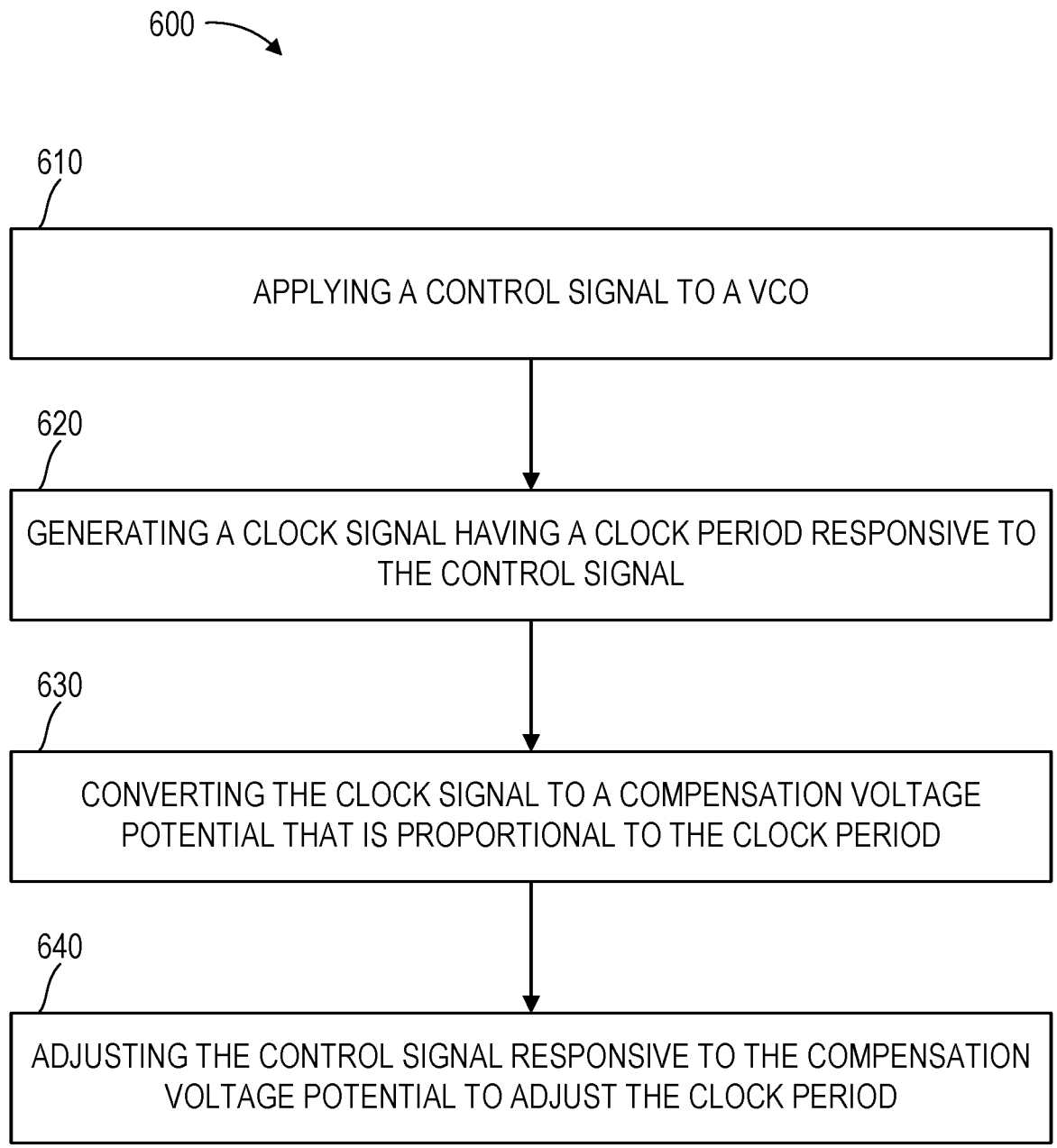
FIG. 6 is a simplified flowchart illustrating a method of operating an oscillator circuit, according to some embodiments.

FIG. 6 is a simplified flowchart illustrating a method 600 of operating an oscillator circuit (e.g., the oscillator circuit 100 of FIG. 1), according to some embodiments. Referring to FIGS. 1 and 6 together, the method 600 includes applying 610 a control signal $V_{CTRL}$ to a VCO 130. In some embodiments, applying 610 a control signal $V_{CTRL}$ to a VCO 130 includes applying a control signal $V_{CTRL}$ that was generated using a bandgap voltage potential $V_{BG}$.

The method 600 also includes generating 620 a clock signal $V_{CLK}$ having a clock period $T_{PERIOD}$ responsive to the control signal $V_{CTRL}$. In some embodiments, generating 620 a clock signal $V_{CLK}$ includes generating a clock signal $V_{CLK}$ by providing a clock signal $V_{CLK}$ having any of a plurality of different clock periods $T_{PERIOD}$ responsive to the control signal $V_{CTRL}$ having a plurality of different voltage potential levels corresponding to the plurality of different clock periods $T_{PERIOD}$.

The method 600 further includes converting 630 the clock signal $V_{CLK}$ to a compensation voltage potential $V_{COMP}$ that is proportional to the clock period $T_{PERIOD}$, using a ZTC current $I_{ZTC}$. In some embodiments, converting 630 the clock signal $V_{CLK}$ to a compensation voltage potential $V_{COMP}$ includes switching an electrically controllable switch 370 (FIG. 3) controllably coupling a capacitor C (FIG. 3) to the ZTC current on and off with the clock signal $V_{CLK}$, and outputting a voltage potential stored on the capacitor C to generate the compensation voltage potential $V_{COMP}$.

The method 600 also includes adjusting 640 the control signal $V_{CTRL}$ responsive to the compensation voltage potential $V_{COMP}$ to adjust the clock period $T_{PERIOD}$ of the clock signal $V_{CLK}$. In some embodiments, adjusting 640 the control signal $V_{CTRL}$ responsive to the compensation voltage potential $V_{COMP}$ to adjust the clock period $T_{PERIOD}$ of the clock signal $V_{CLK}$ comprises maintaining the clock period $T_{PERIOD}$ within about one percent (1%) through a temperature range of about −40° C. to about 120° C.

In some embodiments, applying 610 a control signal $V_{CTRL}$ to a VCO and generating 620 a clock signal $V_{CLK}$ having a clock period $T_{PERIOD}$ responsive to the control signal $V_{CTRL}$ comprises adjusting the clock period $T_{PERIOD}$ of the clock signal $V_{CLK}$ by adjusting the control signal $V_{CTRL}$. In some embodiments, adjusting the clock period $T_{PERIOD}$ of the clock signal $V_{CLK}$ by adjusting the control signal $V_{CTRL}$ comprises adjusting the clock period $T_{PERIOD}$ to be any of a plurality of selectable clock periods linearly spanning a clock period range and incrementing along the clock period range at a fixed period step $\Delta T_{PERIOD}$ (FIG. 4).

Figure 7:
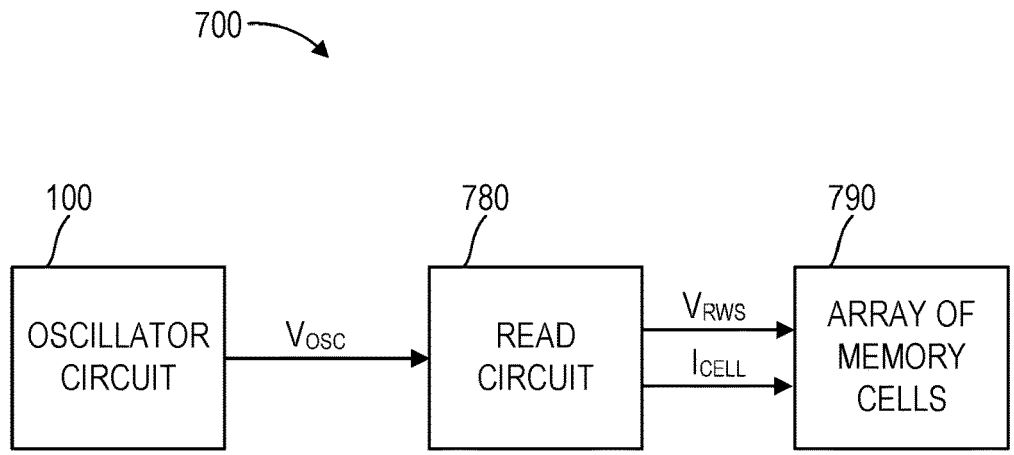
FIG. 7 is a simplified block diagram of a memory device, according to some embodiments.

FIG. 7 is a simplified block diagram of a memory device 700, according to some embodiments. The memory device 700 includes a read circuit 780 operably coupled to an oscillator circuit 100 and an array of memory cells 790. The oscillator circuit 100 is configured to generate an oscillator signal $V_{OSC}$, as disclosed above with reference to FIG. 1. Accordingly, the oscillator circuit 100 has a clock period that is temperature independent and adjustable over a wide period range via fixed period steps. In some embodiments, the clock period is temperature independent over a temperature range spanning about 160° C. In some embodiments, the wide period range over which the oscillator signal $V_{OSC}$ is adjustable spans about sixty-five nanoseconds (65 ns) (e.g., from about 35 ns to about 100 ns). In some embodiments, the fixed period steps are all about equal over the wide period range (e.g., about 1 ns fixed period steps).

The read circuit 780 is configured to generate a ramp signal $V_{RWS}$ (e.g., an RWS mode ramp signal) including a linearly ramped voltage potential that is ramped over time. A timing of the ramping of the ramp signal $V_{RWS}$ is controlled using the oscillator signal $V_{OSC}$. The read circuit 780 is also configured to apply the ramp signal $V_{RWS}$ to the memory cells of the array of memory cells 790. The read circuit 780 is further configured to detect a cell current $I_{CELL}$ of selected memory cells responsive to the ramp signal $V_{RWS}$ being applied thereto. The read circuit 780 is configured to determine a memory state of the selected cells based on the cell current $I_{CELL}$.

By way of non-limiting example, the array of memory cells 790 may include an array of Flash memory cells (e.g., NAND Flash memory cells). The ramp signal $V_{RWS}$ may be applied to one or more cells of the array of memory cells 790, and the cell current $I_{CELL}$ may switch on when the ramp signal $V_{RWS}$ reaches a threshold voltage corresponding to a memory state of the one or more cells. Accordingly, the read circuit 780 can detect the state of the memory cells in the array of memory cells 790. It will be apparent that the oscillator circuit 100 can be used in memory devices other than Flash memory devices (e.g., phase change memory), and other non-memory devices.

As the oscillator circuit 100 is temperature and process independent, and adjustable over a wide period range via fixed period steps, the oscillator circuit 100 prevents errors in memory operations that can occur due to temperature and process fluctuations. As a result, the oscillator circuit 100 is a key component of the memory device 700. Conventional designs for memory devices may be modified to replace conventional oscillators with the oscillator circuit 100 to reduce design margins and overhead due to relatively large design margins on temperature variation that can significantly reduce design, trimming, and testing cost in production.

Figure 8:
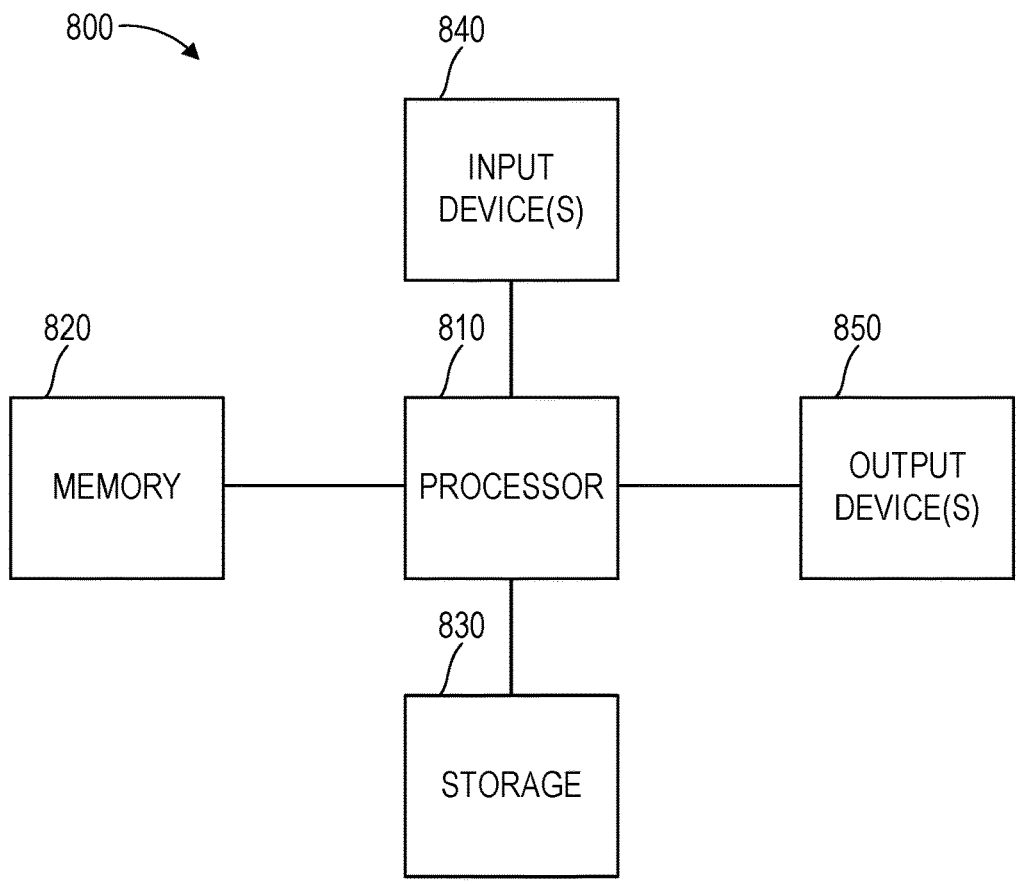
FIG. 8 is a simplified block diagram of a computing device, according to some embodiments.

FIG. 8 is a simplified block diagram of a computing device 800, according to some embodiments. The computing device 800 includes a processor 810 (e.g., a central processing unit (CPU), a microcontroller, etc.) operably coupled to a memory device 820 (e.g., Flash memory, random access memory (RAM), volatile data storage, etc.), a storage device 830 (e.g., a hard drive, a solid state drive, nonvolatile storage, etc.), one or more input devices 840 (e.g., a keyboard, a mouse, a touchscreen sensor, a microphone, a camera, etc.), and one or more output devices 850 (e.g., an electronic display, an audio speaker, a vibration motor, etc.). At least one of the processor 810, the memory 820, the storage device 830, the input devices 840, or the output devices 850 includes the oscillator circuit 100 of FIG. 1. By way of non-limiting example, the memory 820 may include the memory device 700 of FIG. 7.

Figure 9:
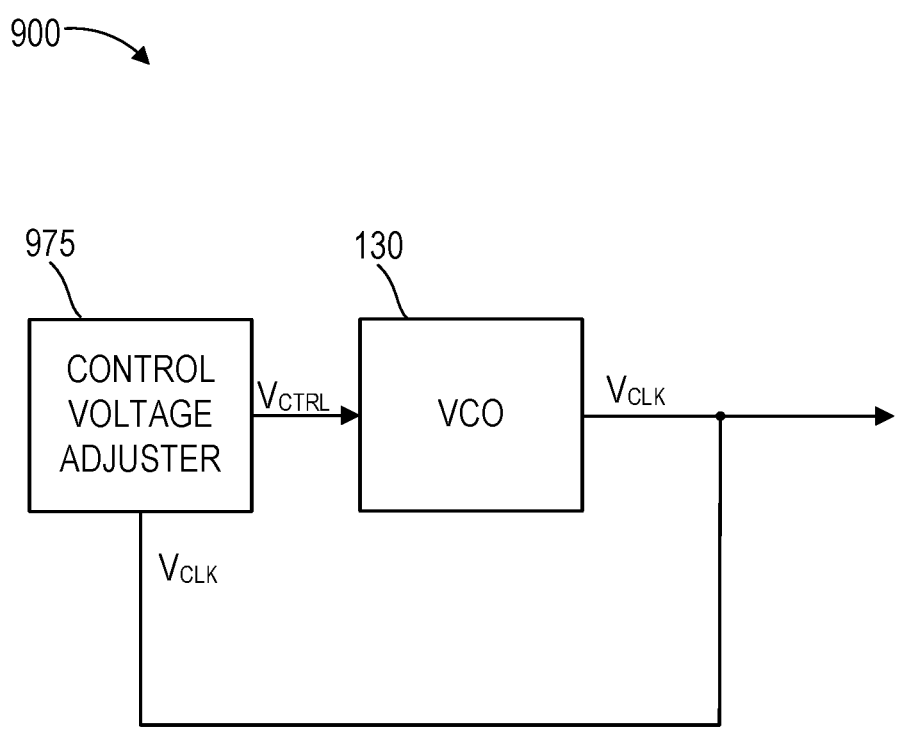
FIG. 9 is a simplified block diagram illustrating an oscillator circuit, according to some embodiments.

FIG. 9 is a simplified block diagram illustrating an oscillator circuit 900, according to some embodiments. The oscillator circuit 900 includes a VCO 130 configured to provide a clock signal $V_{CLK}$ having a clock period that is controllable by a control voltage potential. The oscillator circuit 900 also includes a control voltage adjuster 975 operably coupled to the VCO 130. The control voltage adjuster 975 includes a means for adjusting the control voltage potential $V_{CTRL}$ such that the clock period is adjustable over an operation period range via fixed period steps, and the clock period is temperature independent over a specified operational temperature range for each of a plurality of different selectable clock periods of the clock signal.

In some embodiments, a means for adjusting the control voltage potential includes the reference voltage generator 110, the time to voltage converter 300, and the BG circuit 200 disclosed above with reference to FIGS. 1 and 2. In some embodiments, a means for adjusting the control voltage potential includes the time to voltage converter 300 of FIG. 3. In some embodiments, the a means for adjusting the control voltage potential includes hardware device, a computer programmed with software, or a combination of hardware and a computer programmed with software configured to perform at least a portion of the method 600 of FIG. 6. In some embodiments, a means for adjusting the control voltage potential includes at least a portion of the oscillator circuit 100 of FIG. 7. Moreover, in some embodiments, a means for adjusting the control voltage potential may be at least a portion of the memory device 700 of FIG. 7, the computing device 800 of FIG. 8, or a combination of the memory device 700 and the computing device 800.

It will be apparent to those having skill in the art that many changes may be made to the details of the above-described embodiments without departing from the underlying principles of the invention. The scope of the present invention should, therefore, be determined only by the following claims.

The invention claimed is:

1. An oscillator circuit, comprising:
    a voltage controlled oscillator (VCO) configured to generate a clock signal having a period that adjusts in response to a control signal;
    a time to voltage converter configured to generate a compensation voltage potential from charge of a zero temperature coefficient (ZTC) current during respective periods of the clock signal, wherein the ZTC current is generated using a resistor and voltage generator configured to have substantially same temperature coefficients, such that the ZTC current is substantially temperature independent and the compensation voltage potential is proportional to the respective periods of the clock signal; and
    an amplifier configured to generate the control signal responsive to the compensation voltage potential and a temperature independent reference voltage potential.

2. The oscillator circuit of claim 1, further comprising a ZTC circuit configured to generate the ZTC current from a source voltage potential that varies with temperature in accordance with a first temperature coefficient and a resistor having a resistance that varies with temperature in accordance with a second temperature coefficient, the second temperature coefficient substantially equivalent to the first temperature coefficient.

3. The oscillator circuit of claim 1, further comprising a reference voltage circuit comprising a digital to analog converter configured to adjust the temperature independent reference voltage potential responsive to a digital input indicating one of a plurality of selectable periods of the clock signal.

4. The oscillator circuit of claim 3, wherein the plurality of different selectable periods of the clock signal span a period range linearly from a lowest period to a highest period, with a period step between each one of the selectable periods comprising a constant period step.

5. The oscillator circuit of claim 4, wherein the constant period step is about one nanosecond (1 ns).

6. The oscillator circuit of claim 3, further comprising:
    a bandgap circuit operably coupled to the reference voltage circuit,
    wherein the reference voltage is further configured to adjust the temperature independent reference voltage potential responsive to a bandgap voltage potential generated by the bandgap circuit.

7. The oscillator circuit of claim 3, wherein the plurality of different selectable periods of the clock signal span a range from about thirty-five nanoseconds (35 ns) to about one hundred nanoseconds (100 ns).

8. The oscillator circuit of claim 1, wherein the compensation voltage potential corresponds to an amount of charge carried by the ZTC current during the respective periods of the clock signal.

9. The oscillator circuit of claim 1, wherein the ZTC current is substantially temperature independent within a temperature range from about −40° C. to about 120° C.

10. The oscillator circuit of claim 1, wherein the time to voltage converter comprises a capacitor coupled to the ZTC current by a switch controlled by the clock signal.

11. The oscillator circuit of claim 1, further comprising:
a ZTC circuit including a resistor having a resistor temperature coefficient, the ZTC circuit configured to generate the ZTC current; and
a proportional to absolute temperature (PTAT) circuit having a PTAT temperature coefficient that is about the same as the resistor temperature coefficient, the PTAT circuit operably coupled to the ZTC circuit and configured to generate a PTAT voltage potential,
wherein the ZTC circuit is configured to generate the ZTC current using the PTAT voltage potential and the resistor.

12. A method of operating an oscillator circuit, the method comprising:
applying a control signal to a voltage controlled oscillator (VCO), the VCO configured to generate a clock signal having a clock period responsive to the control signal;
generating a compensation voltage potential, the generating comprising accumulating a zero temperature coefficient (ZTC) current during respective clock periods, wherein the ZTC current is substantially temperature invariant in a temperature range; and
producing the control signal, the control signal configured to adjust the clock period of the clock signal based on the compensation voltage potential.

13. The method of claim 12, wherein generating the compensation voltage potential further comprises:
coupling a capacitor to the ZTC current by a switch controlled by the clock signal; and
outputting a voltage potential stored on the capacitor as the compensation voltage potential.

14. The method of claim 12, wherein adjusting the clock period of the clock signal comprises maintaining the clock period within about one percent (1%) through a temperature range of about −40° C. to about 120° C.

15. The method of claim 12, wherein the ZTC current is substantially temperature invariant between about −40° C. and about 120° C.

16. The method of claim 15, wherein the clock period of the clock signal is adjusted to one of a plurality of selectable clock periods, the selectable clock periods corresponding to respective fixed period steps linearly spanning a clock period range.

17. A memory device, comprising:
a plurality of memory cells;
an oscillator circuit configured to generate a clock signal having a clock period that is temperature independent and adjustable over a wide period range via fixed period steps, the oscillator circuit comprising a current generator configured to produce a temperature independent current by use of a resistor and capacitor having substantially equivalent temperature coefficients, wherein the oscillator circuit is configured to adjust the clock period based on the temperature independent current; and
a read circuit operably coupled to the plurality of memory cells and the oscillator circuit, the read circuit configured to:
generate a ramp signal comprising a linearly ramped voltage potential that is ramped over time, a timing of the ramping of the ramp signal controlled using the clock signal; and
apply the ramp signal to the plurality of memory cells.

18. The memory device of claim 17, wherein the temperature coefficient of the temperature invariant current is substantially zero over a temperature range spanning about 160° C.

19. The memory device of claim 17, wherein the wide period range over which the clock signal is adjustable spans at least about 65 nanoseconds (ns).

20. The memory device of claim 17, wherein the fixed period steps are all about equal over the wide period range.

21. An oscillator circuit, comprising:
a voltage controlled oscillator (VCO) configured to provide a clock signal having a frequency that is controllable by a control voltage potential;
means for producing a zero temperature coefficient (ZTC) current that is substantially temperature independent over a determined temperature range;
means for generating a compensation voltage potential from the ZTC current during respective periods of the clock signal, such that the compensation voltage potential is proportional to the frequency of the clock signal and substantially temperature independent over the determined temperature range; and
means for adjusting the control voltage potential based on the compensation voltage potential such that a frequency of the clock signal is adjustable over an operational period range via fixed period steps and is substantially temperature independent over the determined temperature range for each of a plurality of different selectable clock periods of the operational period range.

* * * * *